US011275187B2

(12) United States Patent
Luhta et al.

(10) Patent No.: US 11,275,187 B2
(45) Date of Patent: Mar. 15, 2022

(54) DETECTOR ARRAY FOR A RADIATION SYSTEM, AND RELATED SYSTEM

(71) Applicant: Analogic Corporation, Peabody, MA (US)

(72) Inventors: Randy Luhta, Chardon, OH (US); Lane Marsden, Reading, MA (US); Ruvin Deych, Gloucester, MA (US); Jeffrey Greenwald, Acton, MA (US); Martin Choquette, Exeter, NH (US); Christopher David Tibbetts, Melrose, MA (US)

(73) Assignee: Analogic Corporation, Peabody, MA (US)

( * ) Notice: Subject to any disclaimer, the term of this patent is extended or adjusted under 35 U.S.C. 154(b) by 0 days.

(21) Appl. No.: 17/008,889

(22) Filed: Sep. 1, 2020

(65) Prior Publication Data
US 2020/0393581 A1   Dec. 17, 2020

Related U.S. Application Data

(63) Continuation of application No. 16/378,168, filed on Apr. 8, 2019, now Pat. No. 10,802,166, which is a (Continued)

(51) Int. Cl.
*G01T 1/20* (2006.01)
*G01T 7/00* (2006.01)
(Continued)

(52) U.S. Cl.
CPC ............. *G01T 7/00* (2013.01); *G01T 1/2018* (2013.01); *H05K 1/025* (2013.01); *H05K 1/0218* (2013.01);
(Continued)

(58) Field of Classification Search
CPC ... G01T 1/1644; G01T 1/2018; G01T 1/2006; G01T 1/202; G01T 1/2985; H01L 27/14661; H01L 27/14663; H01J 9/221
See application file for complete search history.

(56) References Cited

U.S. PATENT DOCUMENTS 4,362,946 A   12/1982  Cusano et al.
6,510,195 B1   1/2003  Chappo et al.
(Continued)

FOREIGN PATENT DOCUMENTS

CN         1532522 A    9/2004
CN       102870006 A    1/2019
(Continued)

OTHER PUBLICATIONS

European Communication pursuant to Article 94(3) EPC for European Application No. 15775308.8, dated Feb. 18, 2021, 5 pages.
(Continued)

*Primary Examiner* — Kiho Kim
(74) *Attorney, Agent, or Firm* — TraskBritt (57) ABSTRACT

A detector array for a radiation system includes a radiation detection sub-assembly, a routing sub-assembly, and an electronics sub-assembly. The routing sub-assembly is disposed between the radiation detection sub-assembly and the electronics sub-assembly and includes one or more layers of shielding material. For example, the routing sub-assembly may include a printed circuit board having embedded therein a shielding material configured to shield the electronics sub-assembly from at least some radiation. In some embodiments, the shielding material defines at least one opening through which a conductive element(s) passes to deliver signals between the radiation detection sub-assembly and the electronics sub-assembly.

18 Claims, 7 Drawing Sheets

Related U.S. Application Data continuation of application No. 15/566,252, filed as application No. PCT/US2015/050934 on Sep. 18, 2015, now Pat. No. 10,254,421.

(60) Provisional application No. 62/147,306, filed on Apr. 14, 2015.

(51) Int. Cl.
*H05K 1/02* (2006.01)
*H01L 27/146* (2006.01)

(52) U.S. Cl.
CPC .. *H01L 27/14623* (2013.01); *H01L 27/14634* (2013.01); *H01L 27/14661* (2013.01); *H01L 27/14663* (2013.01)

(56) References Cited

U.S. PATENT DOCUMENTS

| | | | |
|---|---|---|---|
| 7,112,799 | B2 | 9/2006 | Vogtmeier |
| 2004/0183789 | A1 | 9/2004 | Schopf |
| 2012/0132817 | A1 | 5/2012 | Shaw et al. |
| 2013/0327947 | A1 | 12/2013 | Ronda et al. |
| 2014/0361181 | A1* | 12/2014 | Liu .................. G01T 1/249 250/366 |
| 2017/0307766 | A1* | 10/2017 | Abenaim .............. G01T 1/2018 |

FOREIGN PATENT DOCUMENTS

| | | |
|---|---|---|
| EP | 2560027 A1 | 2/2013 |
| JP | 2009-032936 A | 2/2009 |
| JP | 2009-074964 A | 4/2009 |
| JP | 2009-076726 A | 4/2009 |
| WO | 2004/027454 A1 | 4/2004 |
| WO | 2014/027454 A1 | 2/2014 |

OTHER PUBLICATIONS

Chinese Office Action and Search Report dated Dec. 17, 2018, for CN Application No. 201580080365, 18 pages with translation.
European Communication pursuant to Article 94(3) EPC for European Application No. 15775308.8, dated Jun. 16, 2020, 8 pages.
International Preliminary Report on Patentability received for PCT Patent Application No. PCT/US15/50934, dated Oct. 26, 2017, 12 pages.
International Search Report cited in related application No. PCT/US2015/050934 dated Mar. 11, 2016 (18 pgs).
International Search Report received for PCT Patent Application No. PCT/US2015/050934, dated Mar. 11, 2016, 16 pages.
International Written Opinion received for PCT Patent Application No. PCT/US2015/050934, dated Mar. 11, 2016, 10 pages.
European Communication pursuant to Article 94(3) EPC for European Application No. 15775308, dated Nov. 4, 2021, 4 pages.

\* cited by examiner

FIG. 8 image with no text content of its own — a patent text page.

DETECTOR ARRAY FOR A RADIATION SYSTEM, AND RELATED SYSTEM

CROSS-REFERENCE TO RELATED APPLICATIONS

This application is a continuation of U.S. patent application Ser. No. 16/378,168, now U.S. Pat. No. 10,802,166, issued Oct. 13, 2020, which is a continuation of U.S. patent application Ser. No. 15/566,252 filed Oct. 13, 2017, titled "DETECTOR ARRAY FOR RADIATION SYSTEM," now U.S. Pat. No. 10,254,421, which application is a national phase entry under 35 U.S.C. § 371 of International Patent Application PCT/US2015/050934, filed Sep. 18, 2015, designating the United States of America and published in English as International Patent Publication WO 2016/167830 A1 on Oct. 20, 2016, which application claims priority to U.S. Provisional Application 62/147,306, titled "DETECTOR ARRAY FOR IMAGING MODALITY" and filed on Apr. 14, 2015, the disclosure of each of which is hereby incorporated herein in its entirety by this reference.

BACKGROUND

The present application relates to a radiation detector array having a shielding layer for shielding an electronics sub-assembly of the detector array from radiation photons. It finds particular application in the field of x-ray and gamma-ray radiation systems utilized in medical, security, and/or industrial applications, for example.

Radiation systems such as CT systems, single-photon emission computed tomography (SPECT) systems, digital projection systems, and/or line-scan systems, for example, are useful to provide information, or images, of interior aspects of an object under examination. Generally, the object is exposed to radiation comprising photons (e.g., such as x-rays, gamma rays, etc.), and an image(s) is formed based upon the radiation absorbed and/or attenuated by the interior aspects of the object, or rather a number of radiation photons that are able to pass through the object. Highly dense aspects of the object typically absorb and/or attenuate more radiation than less dense aspects, and thus an aspect having a higher density, such as a bone or metal, for example, will be apparent when surrounded by less dense aspects, such as muscle or clothing.

Radiation systems generally comprise, among other things, one or more radiation sources (e.g., an x-ray source, gamma-ray source, etc.) and a detector array. The detector array comprises, among other things, a radiation detection sub-assembly and an electronics sub-assembly. The radiation detection sub-assembly is configured to convert radiation impingent thereon into electrical charge and the electronics sub-assembly is configured to, among other things, readout electrical charge that has accumulated within the radiation detection sub-assembly and/or digitize an analog signal generated from the readout. While the radiation detection sub-assembly converts most of the radiation impingent thereon into electrical charge, a small percentage of the radiation that impinges the radiation detection sub-assembly traverses the radiation detection sub-assembly and is incident upon the electronics sub-assembly. This interaction of radiation with the electronics sub-assembly may damage the electronics sub-assembly and/or shorten a lifespan of electronics disposed therein, for example.

BRIEF SUMMARY

Aspects of the present application address the above matters, and others. According to one aspect, a detector array for a radiation system comprises a scintillator configured to convert a radiation photon impinging the scintillator into one or more luminescent photons. The detector array comprises a photodetector array configured to convert the one or more luminescent photons into electrical charge. The scintillator is disposed on a first side of the photodetector array. The detector array comprises a routing sub-assembly disposed on a second side of the photodetector array. The routing sub-assembly comprises a dielectric material and a shielding material in proximity to the dielectric material. The shielding material defines at least one opening through which a conductive element is configured to extend. The shielding material is configured to inhibit a passage of one or more radiation photons through the shielding material.

According to another aspect, a detector array for a radiation system comprises a radiation detection sub-assembly configured to convert a radiation photon into electrical charge. The detector array comprises a routing sub-assembly disposed adjacent to the radiation detection sub-assembly. The routing sub-assembly comprises a dielectric material and a shielding material embedded within the dielectric material. The shielding material is configured to inhibit a passage of one or more radiation photons through the shielding material.

According to another aspect, a radiation system comprises a radiation source configured to emit a radiation photon. The radiation system comprises a detector array comprising a radiation detection sub-assembly configured to convert the radiation photon into electrical charge. The radiation system comprises a routing sub-assembly disposed adjacent to the radiation detection sub-assembly. The routing sub-assembly comprises a dielectric material and a shielding material embedded within the dielectric material. The shielding material is configured to inhibit a passage of the radiation photon through the shielding material.

Those of ordinary skill in the art will appreciate still other aspects of the present application upon reading and understanding the appended description.

BRIEF DESCRIPTION OF THE DRAWINGS

The application is illustrated by way of example and not limitation in the figures of the accompanying drawings, in which like references generally indicate similar elements and in which.

DETAILED DESCRIPTION

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing the claimed subject matter.

Direct and indirect radiation systems are configured to convert radiation impingent thereon into electrical charge, which is readout and/or digitized to determine, among other things, an amount of radiation detected by the detector cell during a measurement interval or view. These radiation systems typically comprise a radiation detection sub-assembly configured to convert radiation photons into electrical charge and an electronics sub-assembly configured to convert analog signals generated from the electrical charge into digital signals and/or otherwise process the analog signals and/or digital signals.

At times, radiation photons may pass through the radiation detection sub-assembly and interact with the electronics sub-assembly. Such interactions can introduce noise in the electronics sub-assembly, reduce the useful life of the electronics sub-assembly, and/or otherwise degrade the electronics sub-assembly (e.g., physically and/or functionally).

To mitigate radiation exposure to the electronics sub-assembly, a detector array comprising a routing sub-assembly disposed between the radiation detection sub-assembly and the electronics sub-assembly is provided herein. The routing sub-assembly comprises a dielectric material and a shielding material disposed within and/or proximate to the dielectric material. The shielding material may comprise tungsten, lead, tantalum, leaded glass, heavy metal powder composites (e.g., tungsten powder), etc., configured to attenuate at least some of the radiation that has traversed the radiation detection sub-assembly. In some embodiments, the shielding material can define at least one opening through which a conductive element of the routing sub-assembly can extend to transmit signals between the radiation detection sub-assembly and the electronics sub-assembly. In some embodiments, the shielding material may be disposed under a portion or portions of the radiation detection sub-assembly that have a lower radiation attenuation coefficient such as portions of the radiation detection sub-assembly comprising reflective material and/or dielectric material, for example.

Figure 1:
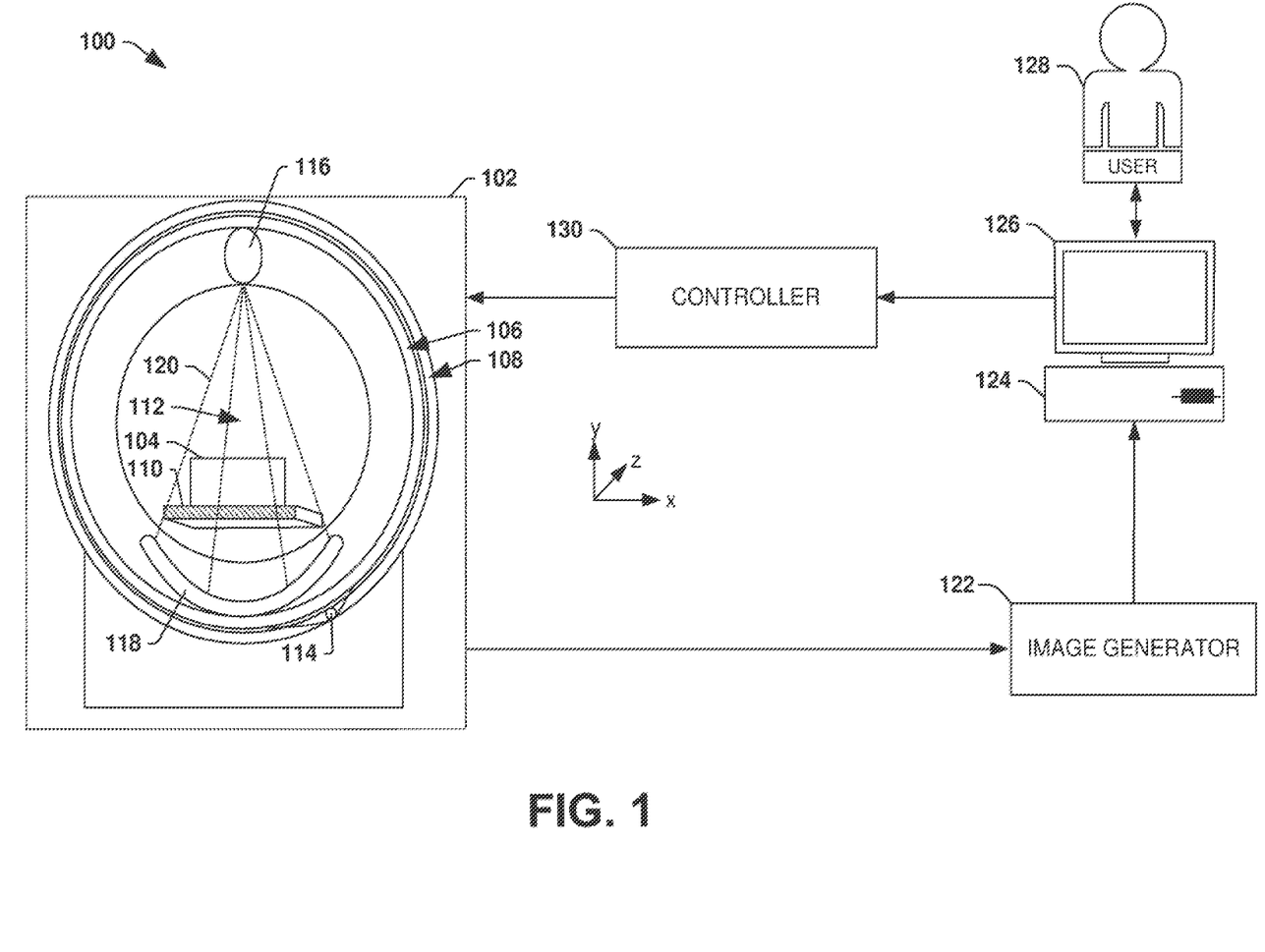
FIG. 1 illustrates an example environment of a radiation system.

FIG. 1 illustrates an example environment 100 of a computed tomography (CT) system comprising a detector array 118 as described herein. It may be appreciated that while the applicability of such detector arrays to a CT system is described herein, such detector arrays may also find applicability in other radiation systems, such as other radiation imaging modalities. For example, the detector arrays may find applicability with line-scan systems, digital projection systems, diffraction systems, and/or other systems configured to detect radiation. Moreover, it may be appreciated that the example environment 100 merely provides an example arrangement and is not intended to be interpreted in a limiting manner, such as necessarily specifying the location, inclusion, and/or relative position of the components depicted therein.

In the example environment 100, an object examination apparatus 102 is configured to examine one or more objects 104 (e.g., a series of suitcases at an airport, a human patient, etc.). The object examination apparatus 102 can comprise a rotor 106 and a stator 108. During an examination of the object(s) 104, the object(s) 104 can be placed on a support article 110, such as a bed or conveyor belt, that is selectively positioned in an examination region 112 (e.g., a hollow bore in the rotor 106 in which the object(s) 104 is exposed to radiation 120), and the rotor 106 can be rotated about the object(s) 104 by a rotator 114 (e.g., motor, drive shaft, chain, etc.).

The rotor 106 can surround a portion of the examination region 112 and can comprise one or more radiation sources 116 (e.g., an ionizing x-ray source, gamma-ray source, etc.) and the detector array 118, which is mounted on a substantially diametrically opposite side of the rotor 106 relative to the radiation source(s) 116. During an examination of the object(s) 104, the radiation source(s) 116 emits fan and/or cone shaped radiation 120 configurations into the examination region 112 of the object examination apparatus 102. It may be appreciated that such radiation 120 can be emitted substantially continuously and/or can be emitted intermittently (e.g., a short pulse of radiation 120 is emitted followed by a resting period during which the radiation source(s) 116 is not activated).

As the emitted radiation 120 traverses the object(s) 104, the radiation 120 can be attenuated differently by different aspects of the object(s) 104. Because different aspects attenuate different percentages of the radiation 120, an image(s) can be generated based upon the attenuation, or variations in the number of radiation photons that are detected by the detector array 118. For example, more dense aspects of the object(s) 104, such as a bone or metal plate, can attenuate more of the radiation 120 (e.g., causing fewer photons to be detected by the detector array 118) than less dense aspects, such as skin or clothing.

The detector array 118 may be configured to indirectly convert (e.g., using a scintillator and photodetectors) or directly convert detected radiation into analog signals. As will be described in more detail below, the detector array 118 may also comprise electronic circuitry, such as an analog-to-digital (A/D) converter, configured to filter the analog signals, digitize the analog signals, and/or otherwise process the analog signals and/or digital signals generated therefrom. Digital signals output from the electronic circuitry may be conveyed from the detector array 118 to digital processing components configured to store data associated with the digital signals and/or further process the digital signals.

In some embodiments, the digital signals are transmitted to an image generator 122 configured to generate image space data, also referred to as images, from the digital signals using a suitable analytical, iterative, and/or other reconstruction technique (e.g., backprojection reconstruction, tomosynthesis reconstruction, iterative reconstruction, etc.). In this way, the data is converted from projection space to image space, a domain that may be more understandable by a user 128 viewing the image(s), for example. Such image space data may depict a two-dimensional representation of the object 104 and/or a three-dimensional representation of the object 104. In other embodiments, the digital signals are transmitted to other digital processing components, such as a threat analysis component, for processing.

The example environment 100 also comprises a terminal 124, or workstation (e.g., a computer), configured to receive the image(s), which can be displayed on a monitor 126 to the user 128 (e.g., security personnel, medical personnel, etc.). In this way, the user 128 can inspect the image(s) to identify areas of interest within the object(s) 104. The terminal 124 can also be configured to receive user input which can direct operations of the object examination apparatus 102 (e.g., a speed of a conveyor belt, activation of the radiation source(s) 116, etc.).

In the example environment 100, a controller 130 is operably coupled to the terminal 124. The controller 130 may be configured to control operations of the object examination apparatus 102, for example. By way of example, in some embodiments, the controller 130 is configured to receive information from the terminal 124 and to issue instructions to the object examination apparatus 102 indicative of the received information (e.g., adjust a speed of a conveyor belt).

Figure 2:
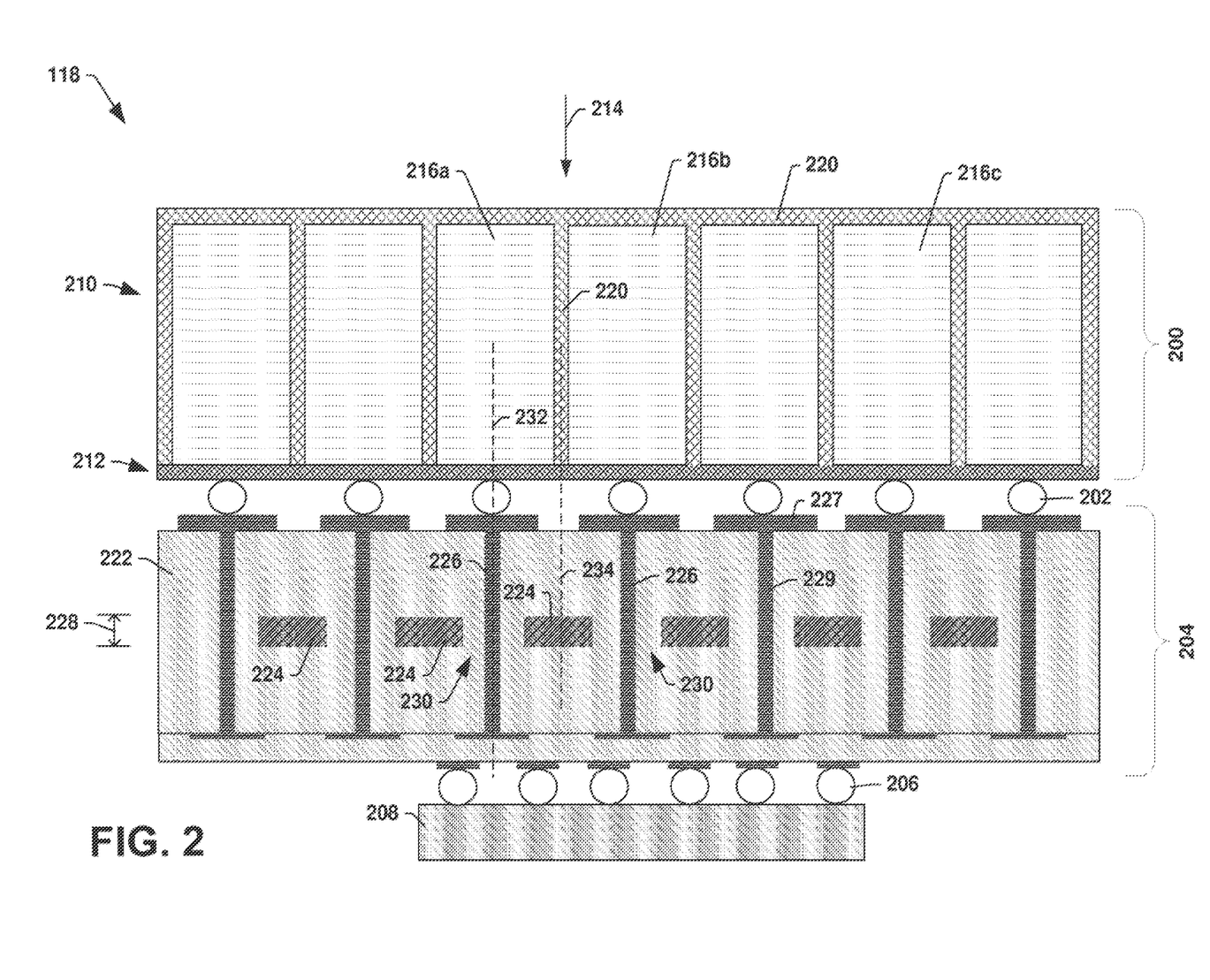
FIG. 2 illustrates a portion of an example detector array.

FIG. 2 illustrates a cross-sectional view of the detector array 118 illustrated in FIG. 1. The detector array 118 comprises a radiation detection sub-assembly 200, a routing sub-assembly 204, and an electronics sub-assembly 208. As will be further described in more detail below, the radiation detection sub-assembly 200 comprises one or more elements configured to detect radiation and/or to generate analog signals indicative of the detected radiation. The routing sub-assembly 204 is configured to route signals (e.g., power signals, communication signals, etc.) between the radiation detection sub-assembly 200 and the electronics sub-assembly 208. The electronics sub-assembly 208 comprises one or more elements configured to process the analog signals (e.g., convert the analog signals to digital signals, filter the analog signals and/or digital signals, etc.). The radiation detection sub-assembly 200 is coupled to the routing sub-assembly 204 by way of a first interconnection layer 202, and the routing sub-assembly 204 is coupled to the electronics sub-assembly 208 by way of a second interconnection layer 206. The first interconnection layer 202 and/or the second interconnection layer 206 may comprise contact pads, solder balls, conductive epoxy, electrically conductive spring contacts, and/or other elements configured to form a physical and/or electrical connection between the radiation detection sub-assembly 200, the routing sub-assembly 204, and the electronics sub-assembly 208.

The radiation detection sub-assembly 200 is configured to convert detected radiation into analog signals. In the illustrated embodiment, the radiation detection sub-assembly 200 is configured to indirectly convert the radiation into electrical charge and comprises a scintillator array 210 and a photodetector array 212 (e.g., a photodiode array). The scintillator array 210 is positioned in a radiation pathway 214 between the photodetector array 212 and the radiation source 116. In other embodiments, the radiation detection sub-assembly 200 may comprise a direct conversion material configured to directly convert radiation into electrical charge. The direct conversion material may comprise, among other things, cadmium zinc telluride (e.g., CZT), cadmium telluride (e.g., CdTe), or other materials configured to convert radiation photons, such as x-ray photons or gamma photons, into electrical charge.

The scintillator array 210 comprises a plurality of scintillators 216a-c respectively configured to convert radiation photons impingent thereon into luminescent photons (e.g., in the visible or infrared wavelength spectrum). Respective scintillators 216a-c may correspond to a detector cell of the detector array 118 and are spaced apart by a gap. Example materials for such scintillators 216a-c can include Gadolinium Oxysulfide (GOS), Cadmium Tungstate, Bismuth Germanate, Cesium Iodide, Sodium Iodide, Lutetium Orthosilicate, and/or an amorphous material, for example.

In some embodiments, at least a portion of the gap defined between respective scintillators 216a-c of the scintillator array 210 may be filled with a light-reflective material 220 configured to reduce and/or limit cross-talk between adjacent scintillators. Further, the light-reflective material 220 may be disposed above the scintillators 216a-c to reflect light down towards the photodetector array 212. In this way, the light-reflective material 220 can be said to surround the scintillators 216a-c. By way of example, the light-reflective material 220 may be disposed between a first scintillator 216a and a second scintillator 216b and above respective scintillators 216a-b.

The photodetector array 212 comprises a plurality of photodetectors, such as back-illuminated photodiodes and/or front-illuminated photodiodes, for example, configured to detect luminescent photons impinging thereon and/or generate electrical charge responsive to detecting the luminescent photons. The electrical charge is periodically sampled to generate an analog signal, which is provided to the electronics sub-assembly 208 via the routing sub-assembly 204. Accordingly, respective photodetectors of the photodetector array 212 are configured to generate an analog signal indicative of the number of luminescent photons detected by the photodetector between samplings (e.g., which correlates to the amount of radiation detected, between samplings, within a region of the scintillator array 210 spatially proximate the photodetector).

The routing sub-assembly 204 is disposed under the radiation detection sub-assembly 200 (e.g., relative to the radiation pathway 214 from the radiation source 116). The routing sub-assembly 204 comprises a dielectric material 222, a shielding material 224, and a plurality of conductive elements 226 (e.g., comprised of conductive pads 227 above the dielectric material and vias 229 extending though the dielectric material 222). The routing sub-assembly 204 is configured to, among other things, route the analog signals from the radiation detection sub-assembly 200 to the electronics sub-assembly 208, provide power to the radiation detection sub-assembly 200, and/or shield the electronics sub-assembly 208 from at least some radiation that has traversed the radiation detection sub-assembly 200.

The dielectric material 222 comprises any number of materials that are electrically insulating and/or are resistant to the flow of electric current therein. For example, the dielectric material 222 can comprise fiberglass, silicon, silicon dioxide, aluminum oxide, sapphire, germanium, gallium arsenide, printed circuit board (e.g., PCB) materials (e.g., laminates, resin impregnated B-stage cloth, etc.), glass reinforced epoxy laminates, FR4 grade materials (e.g., glass epoxy, etc.), etc. In some examples, the dielectric material 222 comprises a substrate, such as a printed circuit board substrate.

A shielding material 224 (e.g., a shielding layer) is disposed in proximity to the dielectric material 222 and is configured to attenuate (e.g., absorb) radiation impingent thereon. For example, as illustrated in FIG. 2, the shielding material 224 is embedded within the dielectric material 222, and thus the shielding material 224 is surrounded on multiple sides (e.g., at least a top side and a bottom side in FIG. 2) by the dielectric material 222. In another example, the shielding material 224 may be in contact with the dielectric material 222 while not being embedded within the dielectric material 222. In such an example, the shielding material 224 can abut and/or be in contact with the dielectric material 222, such that one side of the shielding material 224 is in contact with (e.g., abutting and/or adjacent to) the dielectric material 222, while an opposing side of the shielding material 224 is not surrounded and/or covered by the dielectric material 222. In yet another example, the shielding material 224 can be spaced apart from, but in proximity to, the dielectric material 222. Further, the shielding material 224 may be formed in multiple layers, where the layers may be in contact with one another or may be separated by dielectric material 222, for example (e.g., as discussed with respect to FIG. 8).

The shielding material 224 comprises any number of materials that can inhibit a passage of and/or attenuate at least some of the radiation photons impingent thereon. In an example, the shielding material 224 may comprise tungsten, though other x-ray and/or gamma-ray attenuating materials are envisioned. For example, the shielding material 224 may comprise heavy metals such as lead, tantalum, etc., leaded glass, and heavy metal powder composites (e.g., tungsten powder in a polymer binder). In an example, the shielding material 224 has a thickness 228 that is between about 0.2 millimeters to about 3 millimeters, although the thickness 228 may depend upon a design of the radiation system, including but not limited to radiation energy parameters of the radiation system.

It may be appreciated that while the scintillators 216a-c of the scintillator array 210 may convert a substantial majority of radiation impingent thereon into luminescent photons (e.g., and thus a small percentage of radiation impinging thereon may traverse the scintillators 216a-c), the light-reflective material 220 may attenuate less of the radiation impingent thereon (e.g., and thus a higher percentage of radiation impingent thereon may traverse the light-reflective material 220). Thus, to increase the effectiveness of the shielding material 224, the shielding material 224 may be more highly concentrated under the light-reflective material 220 than under the scintillators 216a-c. For example, the thickness 228 of the shielding material 224 may be tapered such that the thickness 228 of the shielding material 224 is greater below the light-reflective material 220 (e.g., relative to the radiation pathway 214) than below the scintillators 216a-c.

As another example, in some embodiments, openings 230 are defined by the shielding material 224 (e.g., defined within a shielding layer formed by the shielding material 224) through which conductive elements 226 or portions thereof (e.g., the vias 229) can extend to route signals between the radiation detection sub-assembly 200 and the electronics sub-assembly 208. In some embodiments, as shown in FIG. 2, such openings 230 are aligned with (e.g., disposed below) the scintillators 216a-c relative to the radiation pathway 214 (e.g., where the alignment is represented by the dashed line 232). The shielding material 224 is aligned with (e.g., disposed below) the light-reflective material 220 relative to the radiation pathway 214 (e.g., where the alignment is represented by the dashed line 234). Thus, the light-reflective material 220 of the radiation detection sub-assembly 200 may be aligned with (e.g., disposed above in FIG. 2) the shielding material 224 and may be out of alignment with the at least one opening 230. In this way, the shielding material 224 is concentrated under the light-reflective material 220 (e.g., where radiation photons are likely to traverse the radiation detection sub-assembly 200).

The electronics sub-assembly 208 is configured to process the analog signals generated by the radiation detection sub-assembly 200 to generate digital signals. For example, the electronics sub-assembly 208 may comprise analog-to-digital converters, digital-to-analog converters, photon counters, etc., and the processing may include, among other things, filtering the analog signals (e.g., to reduce noise, smooth the signal, enhance aspects of the signal, etc.), converting the analog signals to digital signals, and/or filtering the digital signals.

Figure 3:
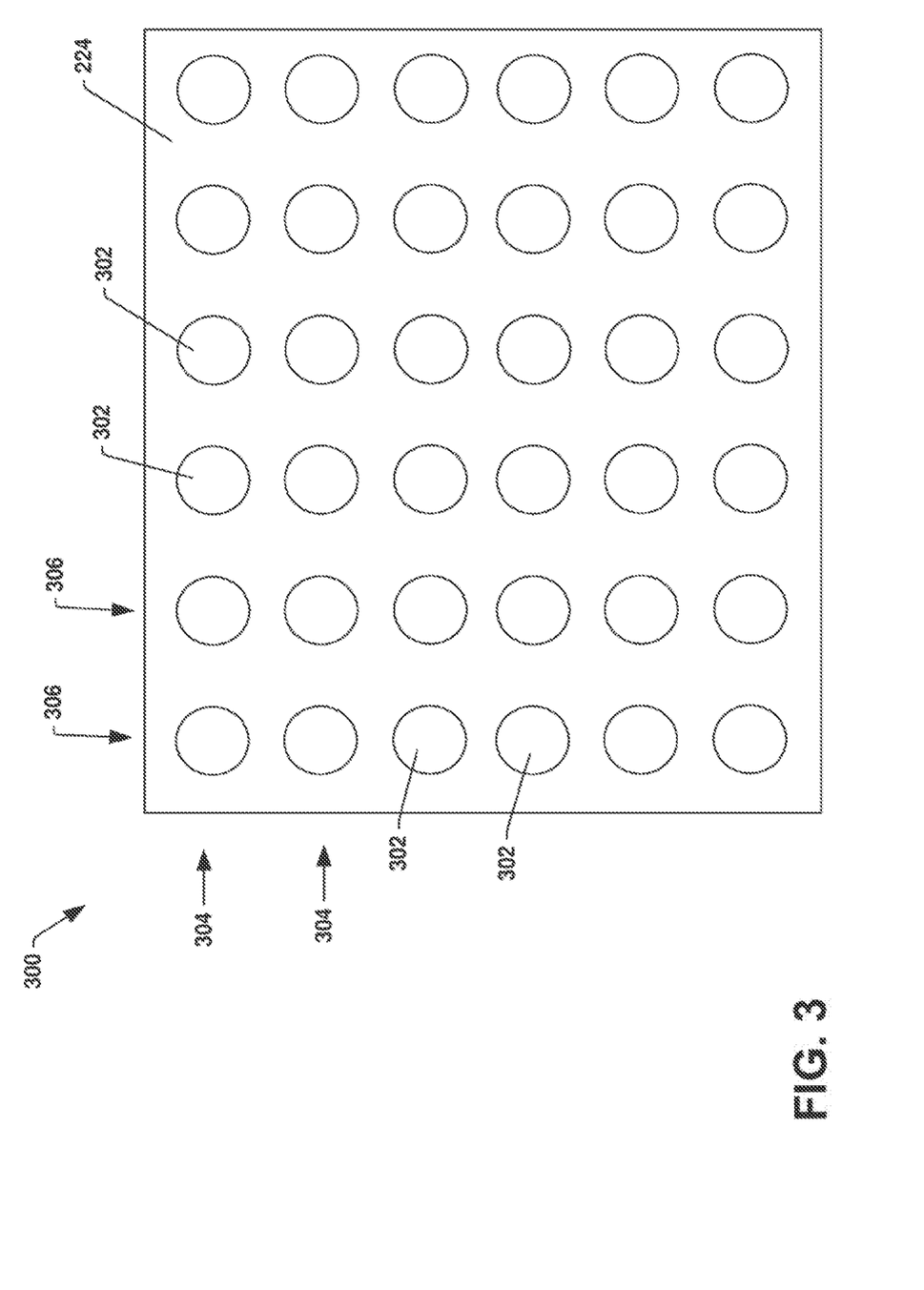
FIG. 3 illustrates an example shielding layer.
Figure 6:
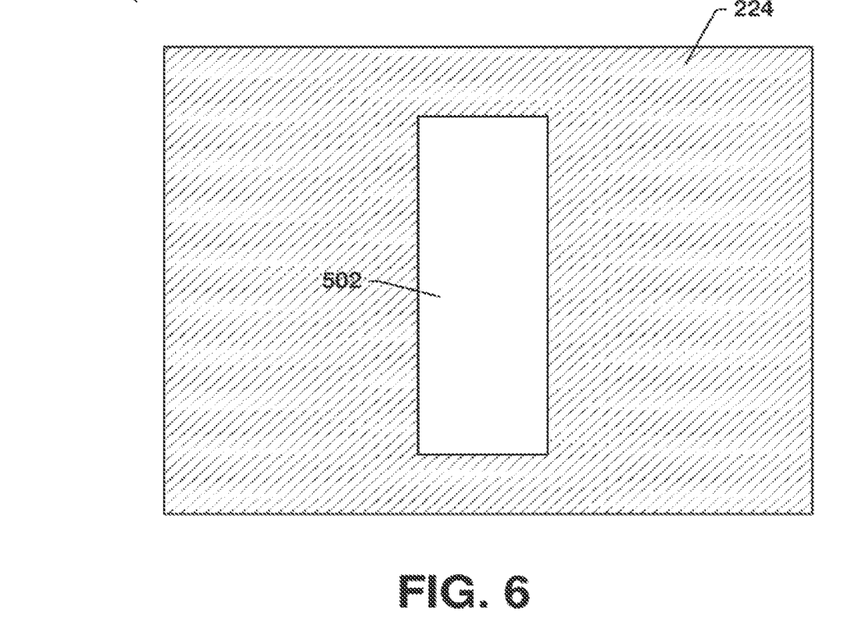
FIG. 6 illustrates an example shielding layer.

Turning to FIG. 3, the shielding material 224 may be formed as a shielding layer 300 which is disposed within the routing sub-assembly 204 during manufacturing of the routing sub-assembly 204, for example. It may be appreciated that by forming the shielding material 224 into a shielding layer 300 as shown in FIG. 3 (and as also shown in FIG. 6), the shielding material 224 may provide an added benefit of structural support to the routing sub-assembly 204 by adding rigidity, stiffness, etc., to the routing sub-assembly 204.

FIG. 3 illustrates a top-down view of this shielding layer 300 (e.g., where the radiation pathway 214 would extend into the page). In this example, the at least one opening 230 defined by the shielding material 224 comprises a plurality of openings 302 that are arranged in a matrix or grid-like manner. In some embodiments, the plurality of openings 302 are arranged in one or more rows 304 and one or more columns 306. The conductive elements 226 can extend through the plurality of openings 302. In some embodiments, referring back to FIG. 2, the scintillators 216a-216c are disposed over respective rows 304 and/or respective columns 306 of the openings 302 (e.g., and thus the scintillators 216a-216c x-ray shadow the openings 302).

It will be appreciated that the plurality of openings 302 are not limited to the illustrated arrangement of FIG. 3, as any number of different arrangements are envisioned. For example, the shielding layer 300 is not limited to comprising the rows 304 and the columns 306. Rather, the openings 302 of the shielding layer 300 can be staggered (e.g., not extending substantially parallel to each other along rows and/or columns), such that the rows 304 and/or the columns 306 may not be present. Similarly, the openings 302 may have a larger or smaller cross-sectional size than as illustrated, so as to accommodate for the passage of the conductive elements 226 or portions thereof (e.g., vias) through the plurality of openings 302. In addition, while the openings 302 are illustrated as having a substantially uniform cross-sectional size in FIG. 3 (e.g., uniform diameter), in other examples, the openings 302 may have a non-uniform cross-sectional size, wherein some openings 302 may be larger than, and/or smaller than, and/or having differing shapes from other openings 302.

Figure 4:
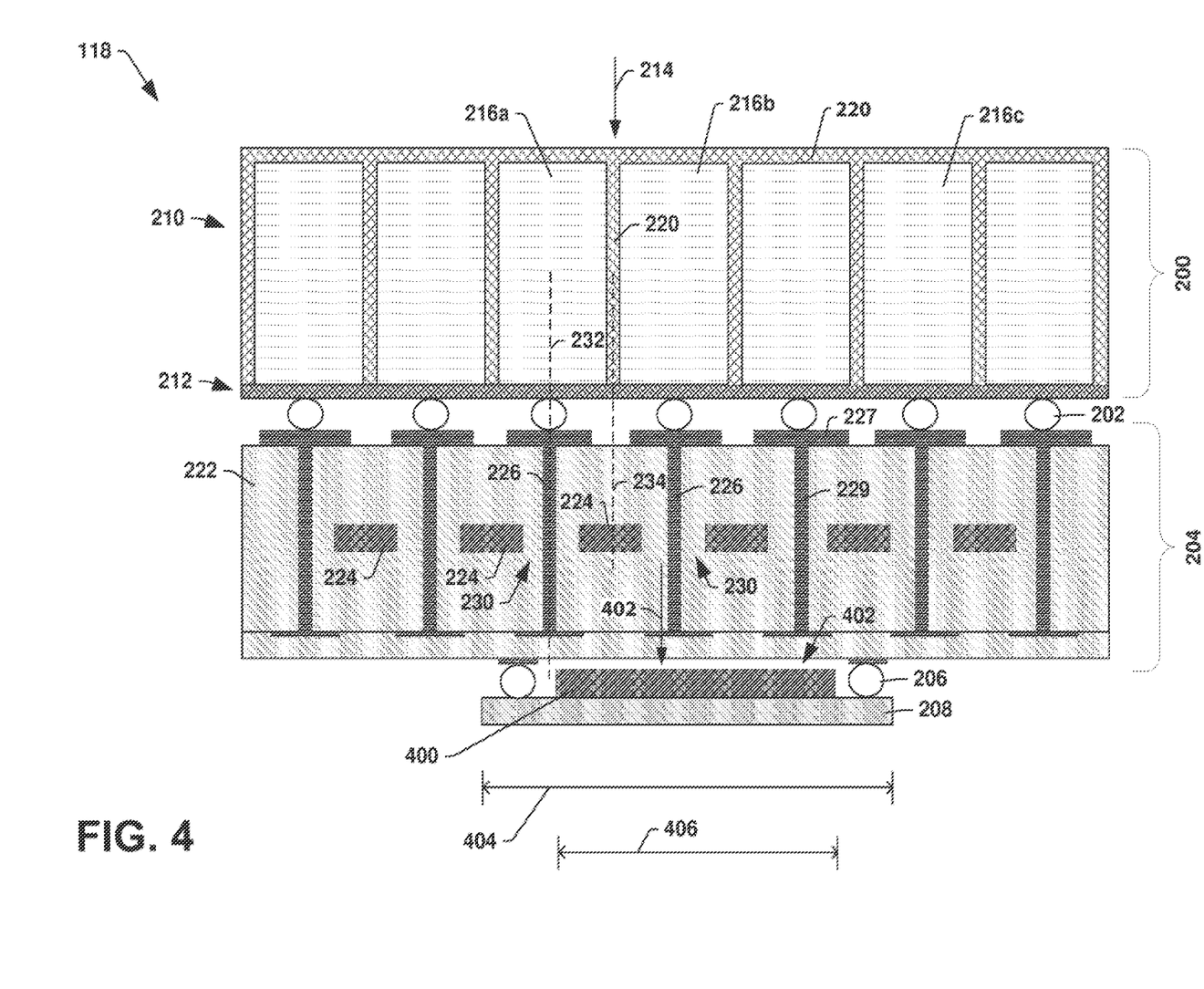
FIG. 4 illustrates a portion of an example detector array.

Turning to FIG. 4, a second embodiment of the detector array 118 is illustrated, where a second shielding material 400 has been added between the routing sub-assembly 204 and the electronics sub-assembly 208. The second shielding material 400 may comprise a same material composition as the shielding material 224 or may comprise a different material composition. In some embodiments, the shielding material 224 forms a first layer and the second shielding material 400 forms a second layer that is substantially parallel to the first layer.

It will be appreciated that the second shielding material 400 is not embedded within the dielectric material 222, but rather is situated below the dielectric material 222. Moreover, the second shielding material 400 may or may not contact the dielectric material 222. For example, the second shielding material 400 may be spaced a distance apart from the dielectric material 222. As such, a space 402 can be defined between the second shielding material 400 and the dielectric material 222.

In some embodiments, the second shielding material 400 is disposed within and/or surrounded by (e.g., co-planar with) the second interconnection layer 206. In an example, a distance 404 across the second interconnection layer 206 (e.g., between opposing sides of the second interconnection layer 206) can be greater than a width 406 of the second shielding material 400.

The second shielding material 400, which is disposed above the electronics sub-assembly 208 can provide additional shielding to the electronics sub-assembly 208. In the illustrated example, the second shielding material 400 may be substantially devoid of openings, gaps, spaces, or the like as signals between the routing sub-assembly 204 and the electronics sub-assembly 208 are routed around the second shielding material 400 (e.g., by way of the second interconnection layer 206).

Figure 5:
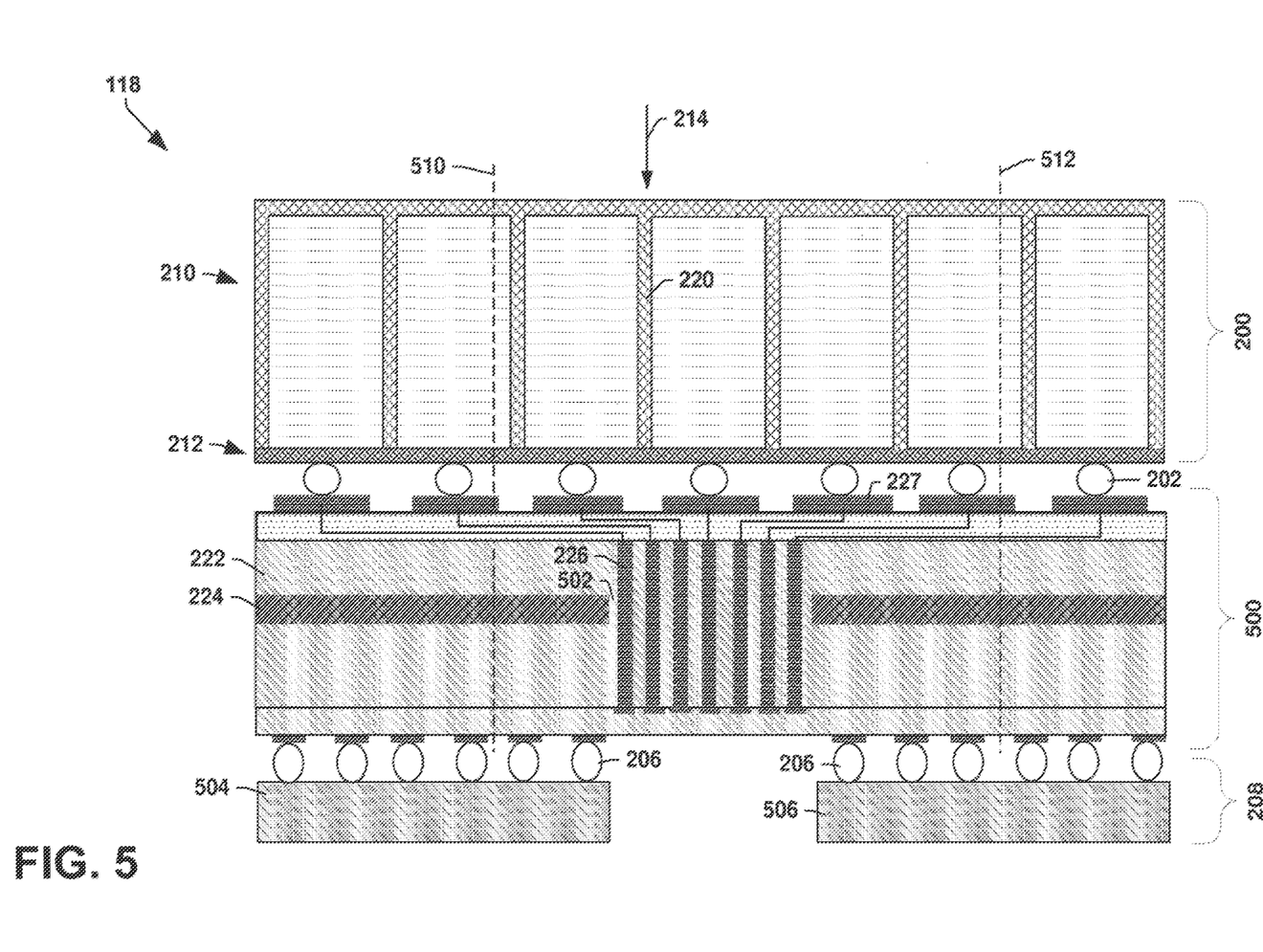
FIG. 5 illustrates a portion of an example detector array.

Turning to FIG. 5, another embodiment of the detector array 118 comprising a second example of a routing sub-assembly 500 is illustrated. In this example, the routing sub-assembly 500 comprises the shielding material 224. By way of example, in some embodiments, a first opening 502 is defined by the shielding material 224 (e.g., defined within the shielding layer) through which conductive elements 226 or portions thereof (e.g., the vias 229) can extend to route signals between the radiation detection sub-assembly 200 and the electronics sub-assembly 208. In this example, the first opening 502 has a size that is that can accommodate a plurality of the conductive elements 226.

In this example, the shielding material 224 can be substantially aligned with (e.g., disposed above) the electronics sub-assembly 208. The electronics sub-assembly 208 may comprise a plurality of sub-assembly portions, such as a first sub-assembly portion 504 and a second sub-assembly portion 506. The first sub-assembly portion 504 can be spaced apart from the second sub-assembly portion 506 to define a gap, a space, an opening, etc., therebetween.

In this example, the shielding material 224 is aligned with (e.g., disposed above) the first sub-assembly portion 504 relative to the radiation pathway 214 (e.g., where the alignment is represented by dashed line 510). In this way, a portion of the shielding material 224 is concentrated above the first sub-assembly portion 504, thus shielding the first sub-assembly portion 504 from at least some of the radiation photons impinging thereon. Moreover, the shielding material 224 is aligned with (e.g., disposed above) the second sub-assembly portion 506 relative to the radiation pathway 214 (e.g., where the alignment is represented by dashed line 512). In this way, a portion of the shielding material 224 is concentrated above the second sub-assembly portion 506, thus shielding the second sub-assembly portion 506 from at least some of the radiation photons impinging thereon.

Turning to FIG. 6, the shielding material 224 may be formed as a shielding layer 600 that is disposed within the routing sub-assembly 204 during manufacturing of the routing sub-assembly 204, for example. FIG. 6 illustrates a top-down view of this shielding layer 600 (e.g., where the radiation pathway 214 would extend into the page). In this example, the first opening 502 defined by the shielding material 224 has a substantially rectangular shape. However, in other examples, the first opening 502 can have a quadrilateral shape that is non-rectangular (e.g., square, etc.), a circular shape, an oval shape, a triangular shape, etc. The first opening 502 is sized to receive a plurality of the conductive elements 226.

Figure 7:
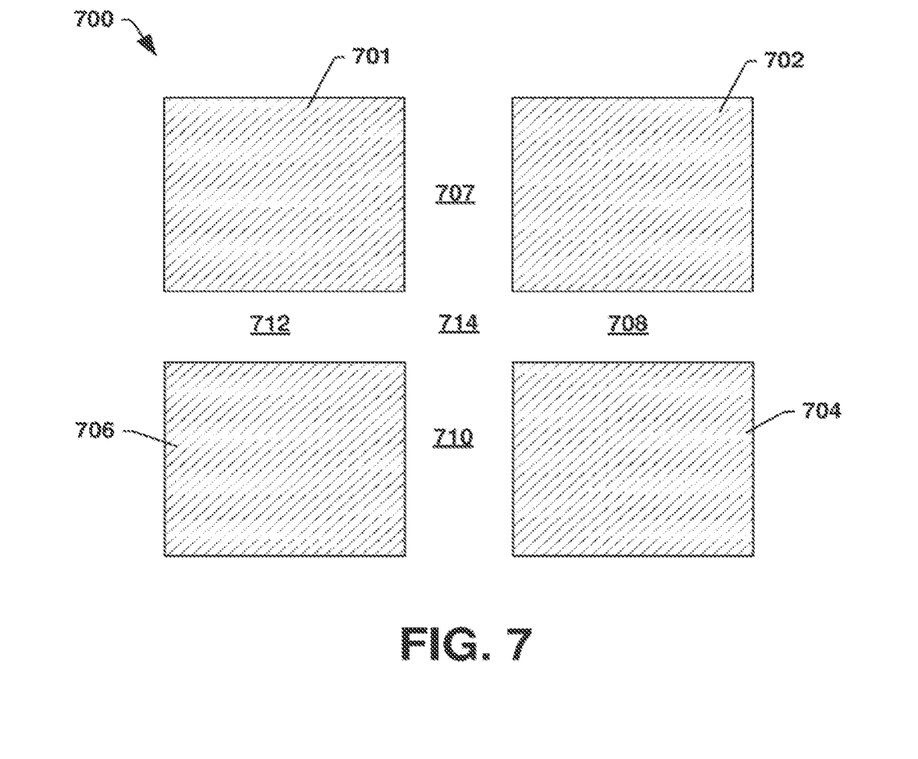
FIG. 7 illustrates an example shielding layer.

Turning to FIG. 7, the shielding material 224 may be formed as a shielding layer 700 that is disposed within the routing sub-assembly 204 during manufacturing of the routing sub-assembly 204, for example. FIG. 7 illustrates a top-down view of this shielding layer 700 (e.g., where the radiation pathway 214 would extend into the page). In this example, the shielding material 224 defines one or more openings. For example, the shielding material 224 may comprise a first shielding portion 701, a second shielding portion 702, a third shielding portion 704, and a fourth shielding portion 706.

In this example, the first shielding portion 701 and the second shielding portion 702 of the shielding layer 700 may be spaced apart to define a first opening 707. The second shielding portion 702 and the third shielding portion 704 of the shielding layer 700 can be spaced apart to define a second opening 708. The third shielding portion 704 and the fourth shielding portion 706 of the shielding layer 700 can be spaced apart to define a third opening 710. The fourth shielding portion 706 and the first shielding portion 701 of the shielding layer 700 can be spaced apart to define a fourth opening 712. A fifth opening 714 can be positioned at a center of the first opening 707, the second opening 708, the third opening 710, and the fourth opening 712. In this example, the first opening 707, the second opening 708, the third opening 710, and the fourth opening 712 may be sized and shaped to receive one or more of the conductive elements 226.

Figure 8:
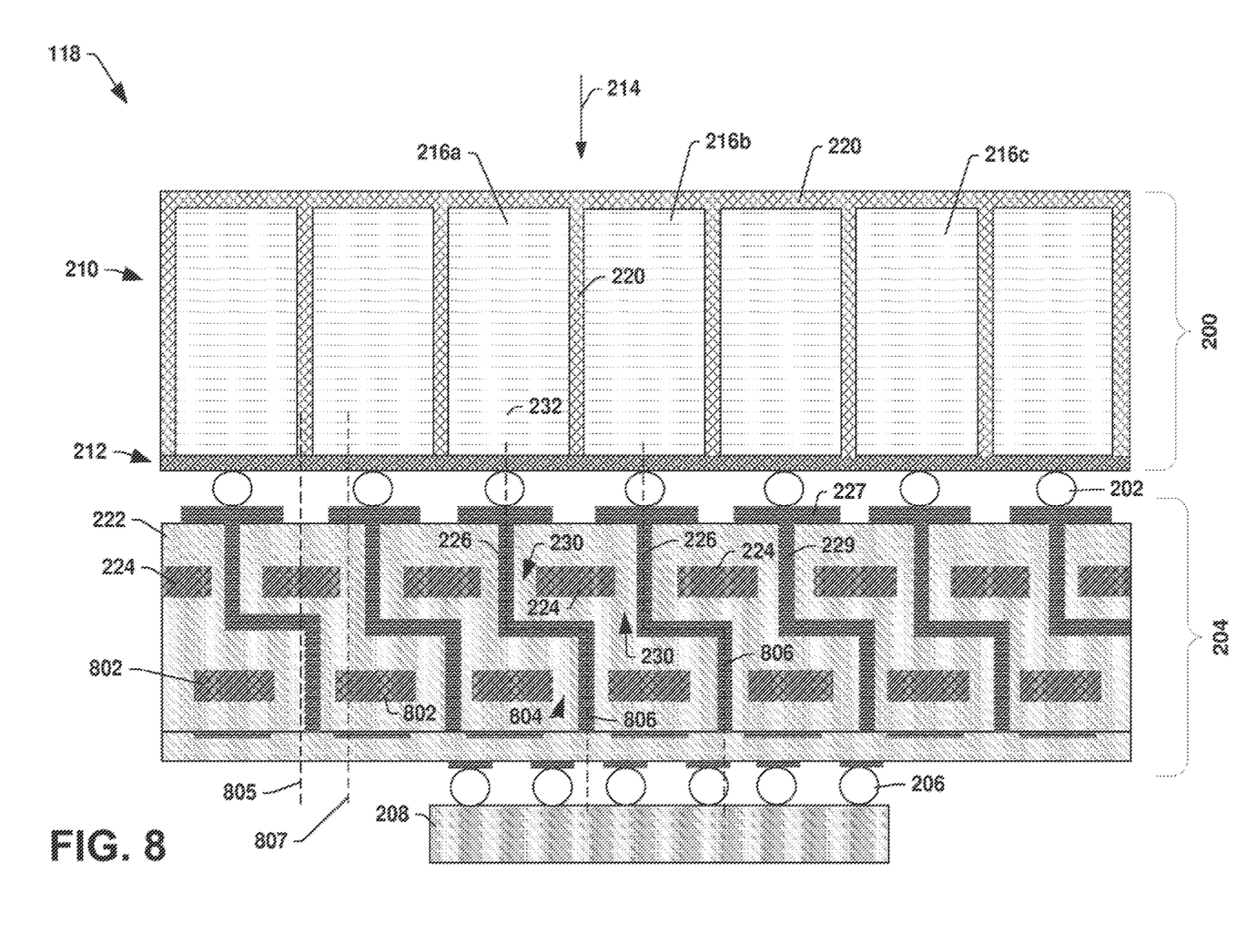
FIG. 8 illustrates a portion of an example detector array.

Turning to FIG. 8, another embodiment of the detector array 118 is illustrated, where a second shielding material 802 has been added to the routing sub-assembly 204. The second shielding material 802 may comprise a same material composition as the shielding material 224 or may comprise a different material composition. In some embodiments, the shielding material 224 forms a first layer and the second shielding material 802 forms a second layer that is substantially parallel to the first layer.

The second shielding material 802 may be embedded within the dielectric material 222 and can extend substantially parallel to the shielding material 224. In this example, the second shielding material 802 can be spaced a distance apart from the shielding material 224, so as to define a gap, a space, an opening, etc., between the shielding material 224 and the second shielding material 802.

In some embodiments, second openings 804 are defined by the second shielding material 802 (e.g., defined within the second layer) through which the conductive elements 226 or portions thereof (e.g., the vias 229) can extend. In some embodiments, as shown in FIG. 8, such second openings 804 are aligned with (e.g., disposed below) the shielding material 224. The shielding material aligned with the second openings 804 relative to the radiation pathway (e.g., where the alignment is represented by the dashed line 805). In some embodiments, as shown in FIG. 8, the openings 230 in the shielding material 224 are aligned with (e.g., disposed above) the second shielding material 802. The second shielding material 802 can be aligned with the openings 230 relative to the radiation pathway (e.g., where the alignment is represented by the dashed line 807). In this way, the second openings 804 defined by the second shielding material 802 are offset relative to the openings 230 defined by the first shielding material 224.

The conductive elements 226 can extend through the openings 230 and the second openings 804 along a non-linear axis 806. In a possible example, the conductive elements 226 may make one or more bends, turns, curves, etc., while extending through the opening 230 and the second opening 804. In another possible example, the conductive elements 226 can extend along a substantially linear axis at an angle (e.g., not parallel) with respect to the radiation pathway 214. In this way, the second shielding material 802 may be concentrated under the openings 230 in the shielding material 224 (e.g., where radiation photons may be likely to traverse the openings 230). The second shielding material 802 can shield the electronics sub-assembly 208 from at least some of the radiation photons impinging thereon.

It will be appreciated that in this example, the second shielding material 802 may be embedded within the dielectric material 222. However, in other examples, the second shielding material 802 is not so limited. In another embodiment, the second shielding material 802 may not be embedded within the dielectric material 222, but, instead, may be spaced apart from (or in contact with a surface of) the dielectric material 222, similar to the second shielding material 400 in the example of FIG. 4.

In this example, the second shielding material 802 can provide an additional layer of attenuation, absorption, etc., for the radiation photons. For example, when the radiation photons extend through the openings 230 in the shielding material 224, these radiation photons may be absorbed, attenuated, etc., by the second shielding material 802. As such, the shielding material 224 and the second shielding material 802 can function to limit the radiation photons from reaching the electronics sub-assembly 208, thus reducing negative effects that the radiation photons may have on the electronics sub-assembly 208.

As used in this application, the terms "component," "module," "system," "interface," and the like are generally intended to refer to a computer-related entity, either hardware, a combination of hardware and software, software, or software in execution. For example, a component includes a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Moreover, "exemplary" is used herein to mean serving as an example, instance, illustration, etc., and not necessarily as advantageous. As used in this application, "or" is intended to mean an inclusive "or" rather than an exclusive "or." In addition, "a" and "an" as used in this application are generally be construed to mean "one or more" unless specified otherwise or clear from context to be directed to a singular form. Also, at least one of A and B and/or the like generally means A or B and/or both A and B. Furthermore, to the extent that "includes," "having," "has," "with," or variants thereof are used, such terms are intended to be inclusive in a manner similar to the term "comprising."

Many modifications may be made to the instant disclosure without departing from the scope or spirit of the claimed subject matter. Unless specified otherwise, "first," "second," or the like are not intended to imply a temporal aspect, a spatial aspect, an ordering, etc. Rather, such terms are merely used as identifiers, names, etc., for features, elements, items, etc. For example, a first set of information and a second set of information generally correspond to set of information A and set of information B or two different or two identical sets of information or the same set of information.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A detector array for a radiation system, the detector array comprising:
   a radiation detection sub-assembly comprising a photodetector array adjacent to a scintillator array; and
   a routing sub-assembly adjacent to the photodetector array, the routing sub-assembly comprising:
      a dielectric material;
      a shielding material adjacent to at least a portion of the dielectric material, gaps between portions of the shielding material exhibiting a cross-shaped cross-section; and
      conductive elements extending through the dielectric material and electrically connecting a first interconnection layer between the photodetector array to a second interconnection layer.

2. The detector array of claim 1, wherein the dielectric material comprises fiberglass, silicon, silicon dioxide, aluminum oxide, sapphire, germanium, gallium arsenide, a printed circuit board material, or a glass reinforced epoxy laminate.

3. The detector array of claim 1, wherein the dielectric material comprises a ceramic material.

4. The detector array of claim 1, wherein the shielding material comprises a unitary material, an opening defined within the shielding material through which the conductive elements extend.

5. The detector array of claim 1, further comprising an electronics sub-assembly in electrical communication with the radiation detection sub-assembly.

6. The detector array of claim 5, wherein the shielding material is substantially aligned with the electronics sub-assembly.

7. The detector array of claim 5, wherein the electronics sub-assembly comprises a first sub-assembly portion spaced from at least a second sub-assembly portion by a gap.

8. The detector array of claim 1, wherein the shielding material defines one or more openings.

9. A radiation system, comprising:
   a radiation source; and
   a detector array configured to detect radiation from the radiation source, the detector array comprising:
      a radiation detector sub-assembly;
      an electronics sub-assembly in electrical communication with the radiation detector sub-assembly; and
      a routing sub-assembly between the radiation detector sub-assembly and the electronics sub-assembly, the routing sub-assembly comprising:
         a shielding material;
         conductive elements extending through an opening in the shielding material and electrically coupling the radiation detector sub-assembly to the electronics sub-assembly; and
         a dielectric material adjacent to the shielding material, wherein the dielectric material spaces the conductive elements from each other.

10. The radiation system of claim 9, wherein the shielding material comprises tungsten, lead, tantalum, leaded glass, or a powder.

11. The radiation system of claim 9, wherein gaps between portions of the shielding material exhibit a cross-shaped cross-section.

12. The radiation system of claim 9, wherein the conductive elements define a smaller lateral area than a first interconnection layer between the radiation detector sub-assembly and the routing sub-assembly.

13. The radiation system of claim 9, wherein the radiation detector sub-assembly comprises a scintillator array and a photodetector array.

14. The radiation system of claim 9, wherein the radiation detector sub-assembly is configured to directly convert the radiation into analog signals.

15. A detector array for a radiation system, the detector array comprising:
   a routing sub-assembly located between a radiation detector sub-assembly and an electronics sub-assembly, the routing sub-assembly comprising:
      a dielectric material between the radiation detector sub-assembly and the electronics sub-assembly;
      a shielding material including at least one surface in contact with the dielectric material; and
      a plurality of conductive elements extending through an opening in the shielding material.

16. The detector array of claim 15, wherein the dielectric material fills spaces between adjacent conductive elements.

17. The detector array of claim 15, wherein the opening in the shielding material comprises a single opening.

18. The detector array of claim 15, wherein the shielding material comprises four portions, each portion of the four portions spaced from the other portions by the dielectric material.

* * * * *